(12) United States Patent
Watanabe

(10) Patent No.: US 7,935,943 B2
(45) Date of Patent: May 3, 2011

(54) FOCUSED ION BEAM PROCESSING SYSTEM AND METHOD

(75) Inventor: Daisuke Watanabe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 353 days.

(21) Appl. No.: 12/144,360

(22) Filed: Jun. 23, 2008

(65) Prior Publication Data

US 2008/0315130 A1  Dec. 25, 2008

(30) Foreign Application Priority Data

Jun. 25, 2007  (JP) ................................ 2007-166426

(51) Int. Cl.
*H01J 37/08* (2006.01)
(52) U.S. Cl. ................ 250/492.21; 250/307; 250/309
(58) Field of Classification Search ............. 250/492.21
See application file for complete search history.

(56) References Cited

U.S. PATENT DOCUMENTS

| 5,270,552 | A | * | 12/1993 | Ohnishi et al. | ............... | 250/307 |
| 5,952,658 | A | * | 9/1999 | Shimase et al. | ............... | 850/63 |
| 5,969,273 | A | * | 10/1999 | Archie et al. | ............... | 73/865.8 |
| 6,031,229 | A | * | 2/2000 | Keckley et al. | ............... | 850/43 |
| 7,348,556 | B2 | * | 3/2008 | Chitturi et al. | ............... | 250/309 |

FOREIGN PATENT DOCUMENTS

JP  2004-361140 A  12/2004

* cited by examiner

*Primary Examiner* — Phillip A Johnston
(74) *Attorney, Agent, or Firm* — Sughrue Mion, PLLC

(57) ABSTRACT

A focused ion beam (FIB) processing system includes a FIB irradiation unit that irradiates a FIB onto a pattern formed in a wafer, to form a section of the pattern, an imaging unit that images the section of the pattern, a calculation unit that calculates a pattern size based on the image of the section, a judgment unit that judges whether or not a differential of the pattern size with respect to time is equal to or below a threshold; and a control unit that stops the FIB irradiation unit if the judgment unit judges that the differential of the pattern size is equal to or below the threshold.

10 Claims, 10 Drawing Sheets

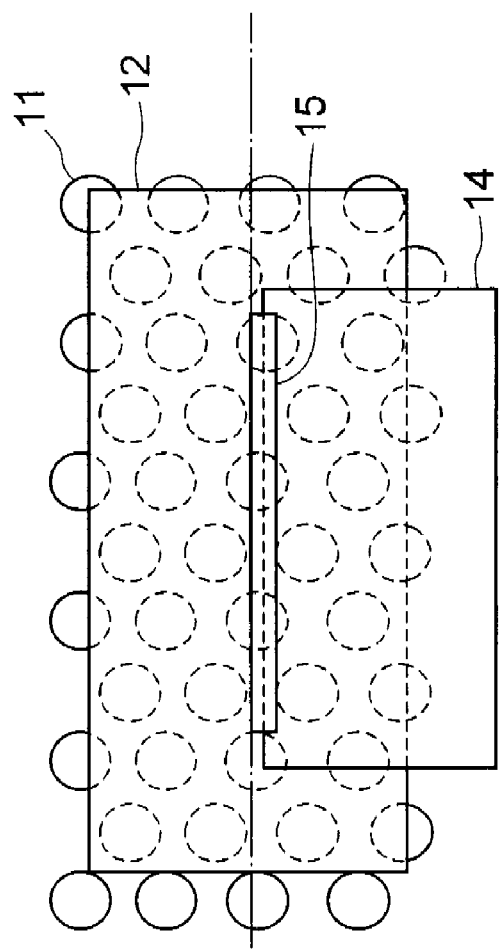
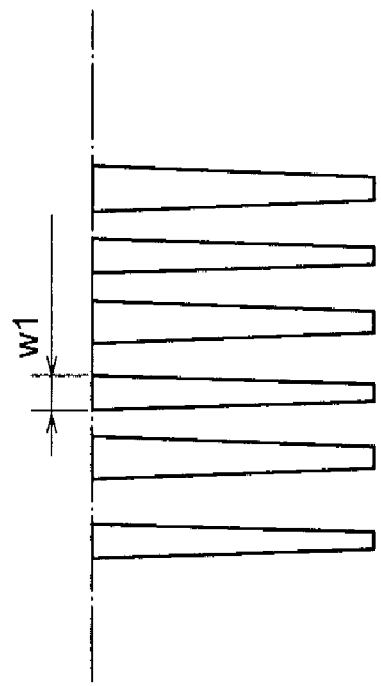
FIG. 2A
FIG. 2B

FOCUSED ION BEAM PROCESSING SYSTEM AND METHOD

FIELD OF THE INVENTION

The present invention relates to a focused ion beam (FIB) processing system and a FIB processing method, and more particularly, to FIB processing system and FIB processing method for analyzing a pattern in a semiconductor wafer by using a FIB-etching processing.

BACKGROUND OF THE INVENTION

Along with development of finer patterning in a semiconductor device, there has been occurring of the problem of a malfunction in the contact-hole processing by which contact plugs are formed. Examples of the malfunction in the contact-hole processing include an undesirable shape, insufficient etching or deposited residues after the etching for forming contact holes, and insufficient filling of the contact holes after deposition of contact plugs. In a conventional technique, if a suspected problem occurs at a specific location after the contact-hole processing, the specific location is inspected by a FIB-SEM processing including a FIB-etching processing and a subsequent inspection processing using a scanning electron microscope (SEM), or a FIB-TEM processing using a FIB-etching processing and a subsequent inspection processing using a transmission electron microscope (TEM).

In the up-to-date semiconductor manufacturing process, FIB-SEM systems having a FIB-SEM inspection function have become widely used, contributing to improvement in the analysis of the problem occurring therein. However, since this analysis requires a longer processing time and necessitates mastery of the skill for using the FIB-SEM system, there is a difficulty in the practical use of the FIB-SEM system in the semiconductor fabrication industry. FIG. 10 shows a typical FIB-SEM system used for inspection of a semiconductor wafer. In particular, the FIB-SEM systems now in widespread use generally have an angle of 30 to 60 degrees between the axis of the FIB device 21 and the axis of the SEM device 22, wherein the FIB device 21 is dedicated to etching of a wafer 23 by irradiating a FIB and the SEM device 22 is dedicated to inspection of the section of the wafer from an angled direction with respect to the axis of the FIB device. The FIB-SEM system is described in Patent Publication JP-2004-361140A, for example.

FIG. 11 is a flowchart showing the procedure of processing a semiconductor wafer by a conventional FIB-SEM system. In this processing, the FIB device performs a FIB-etching processing so that a desired section of the contact pattern including an array of contact plugs is exposed from the main surface of the wafer. The exposed section is generally perpendicular to the main surface of the wafer or at least intersects the main surface.

The FIB-etching processing includes the steps of setting coordinates for processing in accordance with an alignment mark of the wafer (step S1), and imaging the contact pattern on the wafer surface (step S2). The FIB-etching processing further includes the steps of setting the area for FIB-etching processing on the wafer surface as well as the beam conditions for the FIB etching (step S3). Thereafter, the FIB-etching processing is started using a scanning irradiation technique in a line-by-line basis within the area thus set (step S4). After the etching by the scanning irradiation is finished up to the specified location based on the location information on the wafer surface, the section of the pattern thus exposed from the wafer surface is subjected to an inspection to judge whether or not a desired section is obtained by the FIB-etching processing. If it is judged that a desired section is not yet obtained, a further FIB-etching processing is performed for correction of the exposed section (step S5).

As described above, it is difficult to obtain the desired exposed section in the FIB-etching processing merely from the location information on the wafer surface. That is, a desired exposed section generally necessitates correction of the exposed section based on an inspection by a user of the system. In addition, the judgment as to whether or not the desired exposed section is obtained and a judgment of subsequent correction depend on the skill of the user operating the FIB-SEM system. Thus, it is generally difficult to obtain a desired exposed section in the FIB-SEM system.

In view of the above problem in the conventional technique, it is an object of the present invention to provide a FIB-etching processing system and a FIB-etching processing method, which are capable of obtaining a desired exposed section in a semiconductor device, substantially without correction based on the judgment by a user.

The present invention provides a focused ion beam (FIB) processing system including: a FIB irradiation unit that irradiates a FIB onto a pattern formed in a wafer, to form a section of the pattern that intersects a top surface of the wafer; an imaging unit that images the section of the pattern; a calculation unit that calculates a pattern size based on the image of the section; a judgment unit that judges whether or not a differential of the pattern size with respect to time is equal to or below a threshold; and a control unit that stops the FIB irradiation unit if the judgment unit judges that the differential of the pattern size is equal to or below the threshold.

The present invention also provides a focused ion beam (FIB) processing system including: a FIB irradiation unit that irradiates a FIB onto a pattern formed in a wafer, to form a section of the pattern that intersects a top surface of the wafer; an imaging unit that images the section of the pattern; a calculation unit that calculates a pattern size based on the image of the section, to store in a storage device the pattern size in association with a time instant at which the section of the patter is imaged; a function unit that determines a time function of the pattern size based on the pattern size and time instant; and a control unit that controls a stop position of the FIB irradiation unit based on the time function.

The present invention further provides a focused ion beam (FIB) processing method including: irradiating a FIB onto a pattern formed in a wafer, to form a section of the pattern that intersects a top surface of the wafer; imaging the section of the pattern; calculating a pattern size on the section based on the image of the section; judging whether or not a differential of the pattern size with respect to time is equal to or below a threshold; and stopping the FIB irradiation if it is judged that the differential of the pattern size is equal to or below the threshold.

The present invention further provides a focused ion beam (FIB) processing method including: irradiating a FIB onto a pattern formed in a wafer, to form a section of the pattern that intersects a top surface of the wafer; imaging the section of the pattern; calculating a pattern size on the section based on the image of the section, to store the pattern size in association with a time instant at which the section of the pattern is imaged; determining a time function of the pattern size based on the pattern size and time instant; and controlling a stop position of the FIB irradiation based on the time function.

The above and other objects, features and advantages of the present invention will be more apparent from the following description, referring to the accompanying drawings.

BRIEF DESCRIPTION OF THE DRAWINGS

FIGS. 2A and 2B are a top plan view and a sectional view, respectively, of a target semiconductor wafer at a time instant T1 during a finishing treatment.

DESCRIPTION OF EMBODIMENTS

Figure 1:
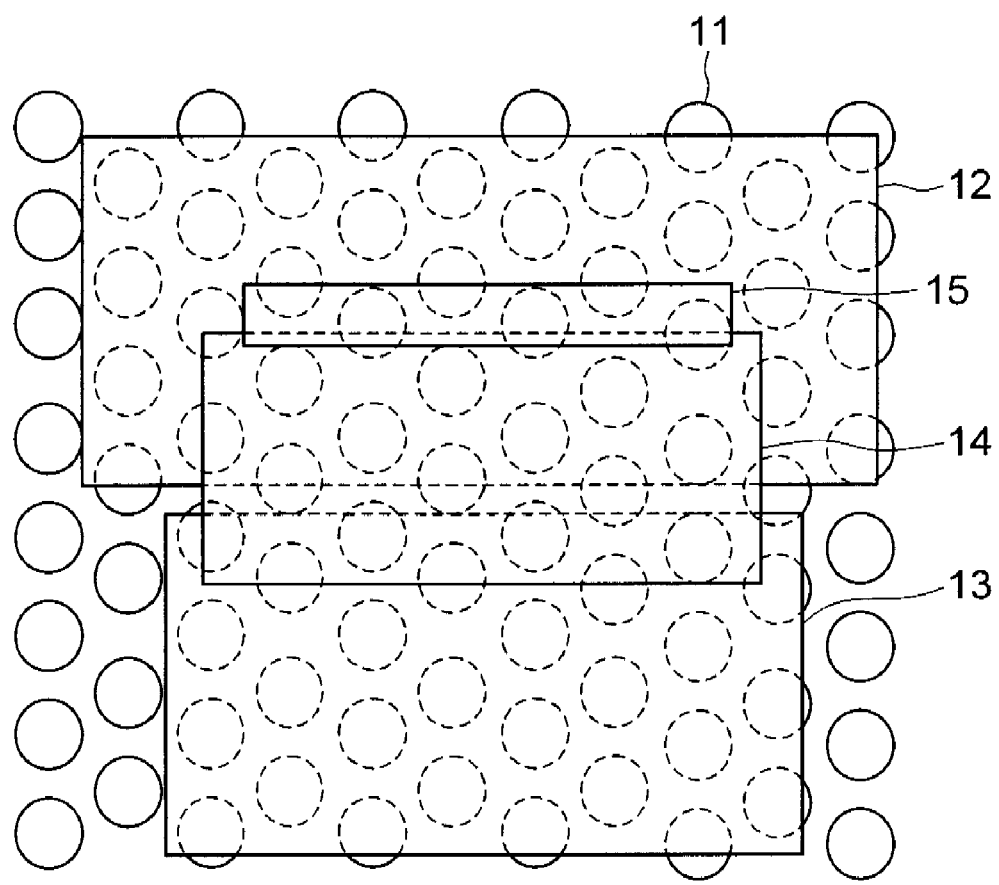
FIG. 1 is a top plan view exemplifying processing areas determined for respective treatments in the FIB-etching processing set on a semiconductor wafer.

Now, exemplary embodiments of the present invention will be described with reference to the accompanying drawings, wherein similar constituent elements are designated by similar reference numerals throughout the drawings.

Figure 10:
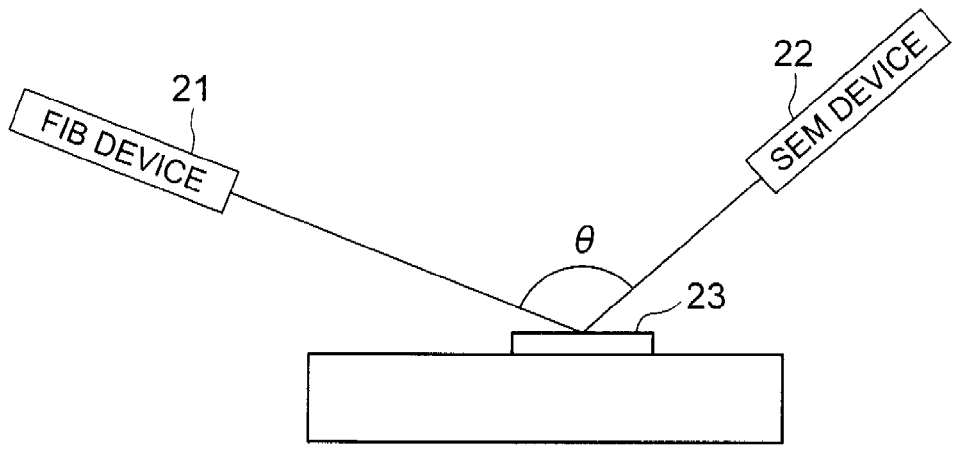
FIG. 10 is side view of a typical FIB-SEM system.
Figure 11:
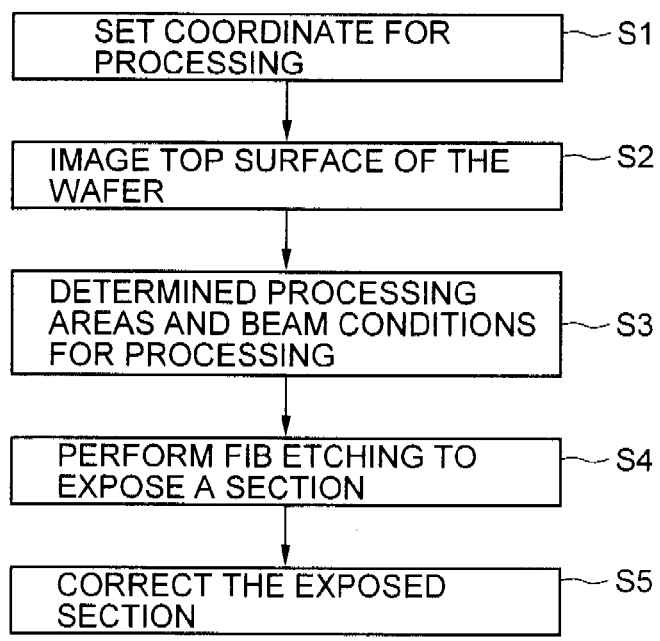
FIG. 11 is a flowchart of the procedure of a conventional FIB-etching processing.

The FIB-SEM system according to the present invention is similar to the typical FIB-SEM system shown in FIG. 10. The FIB device 21 irradiates the wafer 23 to generate an exposed section which is substantially perpendicular to the wafer surface, and the SEM device 22 monitors the exposed section by imaging the section of the target pattern.

FIG. 1 is a top plan view exemplifying a target semiconductor wafer to which a FIB-etching processing according the present invention is applied, wherein areas for respective treatments in the FIB-etching processing are exemplified. In the semiconductor wafer, a plurality of contact plugs are arranged in a triangular array to form a contact pattern, each of the contact plugs being formed as a cylinder having a circular cross section.

On the main surface of the semiconductor wafer, a plurality of processing areas are set before starting treatments of the FIB-etching processing. The areas set for the treatments of the FIB-etching processing include a protective-film processing area 12 for forming therein a tungsten (W) protective film, a coarse-etching area 13 for a coarse-etching treatment performed as the first treatment, an intermediate-etching area 14 for an intermediate-etching treatment succeeding to the coarse-etching treatment, and a fine-etching area 15 for a fine-etching treatment performed as the last etching treatment after the intermediate-etching treatment. The protective film is formed on the semiconductor wafer before performing the FIB-etching processing in the area overlying the desired exposed sections of the contact plugs during the fine-etching treatment. The protective film is formed by deposition onto the wafer surface by supplying a source gas while irradiating the protective-film processing area 12 with a FIB by using the FIB device.

The FIB-etching processing is performed by consecutively performing a coarse-etching treatment, an intermediate-etching treatment, and a fine-etching treatment, which are executed by FIB irradiation within the respective areas 13, 14 and 15. The FIB irradiation is performed by scanning in a line-by-line basis at a specified scanning rate in each of the coarse-etching treatment, intermediate-etching treatment, and fine-etching treatment. The direction of FIB irradiation is inclined by a specified angle with respect to the perpendicular to the main surface of the wafer. The SEM device monitors the image of the exposed section appearing from the wafer surface, with the advance of FIB-etching processing. The SEM device controls the FIB-etching processing at the final stage of the fine-etching treatment so that the FIB irradiation stops at the end of the FIB-etching processing.

FIGS. 2A and 2B are a top plan view and a sectional view (SEM sectional view), respectively, of the semiconductor wafer at a time instant T1 at which the FIB-etching processing shifts from the intermediate-etching treatment to the fine-etching treatment. In FIG. 2A, the coarse-etching area is omitted for depiction. FIG. 2B shows an exposed vertical section of the contact plugs 11 as the target for the SEM image, the section being obtained by the FIB-etching processing at this stage of the etching. The contact plugs 11 have a pattern width w1 (nanometer), as shown in FIG. 2B, at this time instant T1. The SEM device calculates the pattern width w of the contact plugs 11 based on the image of the exposed section of the contact plugs 11 after the end of intermediate-etching treatment, and monitors the pattern width w thus calculated.

Figure 3B:
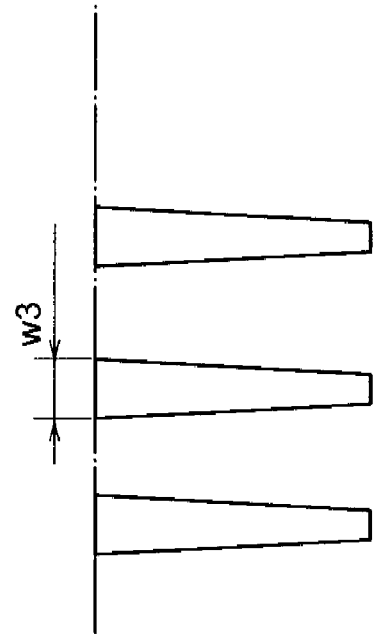
FIGS. 3A and 3B are a top plan view and a sectional view, respectively, of the semiconductor wafer at a time instant T3 at which circular contact plugs have a maximum width on an exposed section.
Figure 3A:
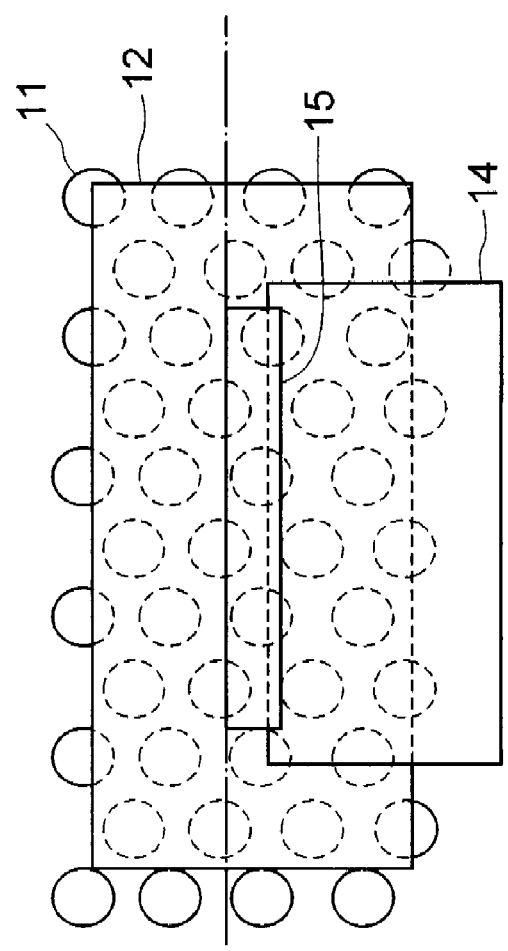

FIGS. 3A and 3B show, similarly to FIGS. 2A and 2B, respectively, the semiconductor wafer at a step at which the pattern width w has a maximum of w3 after the fine-etching treatment advances to some extent from the step of FIGS. 2A and 2B. That is, the exposed section at this stage stays at the plane passing through the center of the contact plugs 11, whereby the pattern width w3 at this stage (time instant T3) has a maximum and is equal to the diameter (A) of the contact plugs 11. Stop of the FIB-etching processing at this stage may provide a desired exposed section of the contact pattern.

Figure 4A:
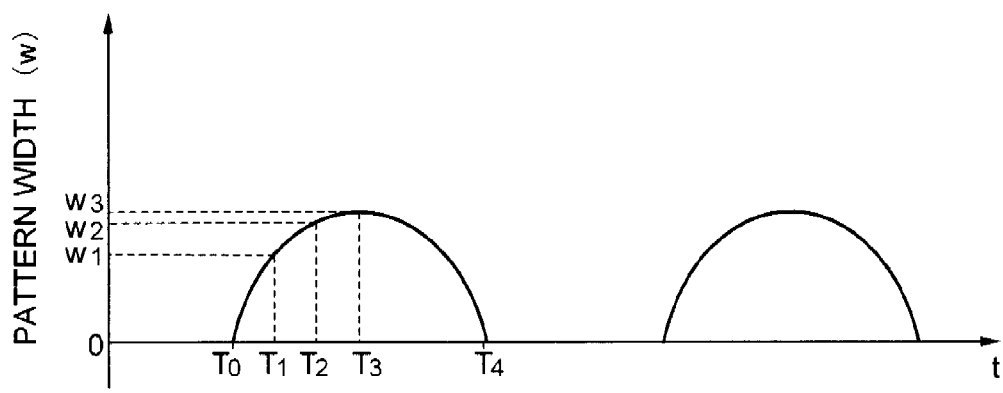
FIGS. 4A and 4B are graphs showing a change of pattern size with respect to time and a change of the differential of the pattern size, respectively.
Figure 4B:
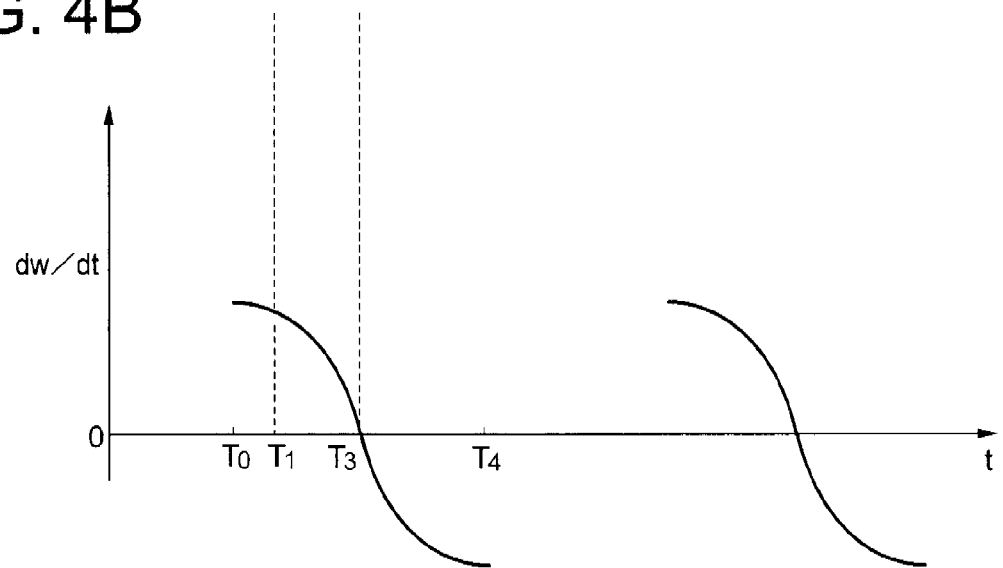

FIG. 4A shows a graph showing the change of the observed pattern width w of the contact plugs, which is plotted with respect to the elapse of processing time during the fine-etching treatment. FIG. 4B is the differential, dw/dt, of the pattern width of the graph shown in FIG. 4A. In these drawings, T0, T1, T2, T3 and T4 are the time instants at which the contact plugs, i.e., the target for monitoring, appear on the exposed section, at which the contact plugs stay in the step of FIGS. 2A and 2B, at which the pattern width increases from the step of FIGS. 2A and 2B, at which the pattern width assumes the maximum w3, and at which the contact plugs disappear from the exposed section, respectively.

As shown in FIG. 4A, the pattern width w of the contact plugs appearing on the etched section is a function of time (t), and may be expressed by:

$$w = A \cdot \sin \omega(t-T0) \quad (1),$$

for the range of "t": $T0 \leq t \leq T4$.

The differential of pattern width w with respect to time (t) is expressed by:

$$dw/dt = A \cdot \omega \cdot \sin \omega(t-T0) \quad (2)$$

for the range of "t" as described above.

By monitoring the temporal differential, or dw/dt, to detect the time instant at which dw/dt assumes zero, the time instant T3 at which the pattern width w assumes a maximum w3 can be detected, without the information of the diameter itself of the contact plugs. This provides a desired exposed section of the contact pattern. In addition, if the diameter of the contact plugs is a known value, the above equation (1) can be determined by calculating the pattern widths w1 and w2 obtained at arbitrary time instants T1 and T2, so long as T0≦T1≦T3, and T0≦T2≦T3 are satisfied. This equation, if calculated, provides the conclusion that a section obtained based on the image data at a time instant when the calculated pattern width is equal to the maximum width is the desired exposed section.

Figure 5:
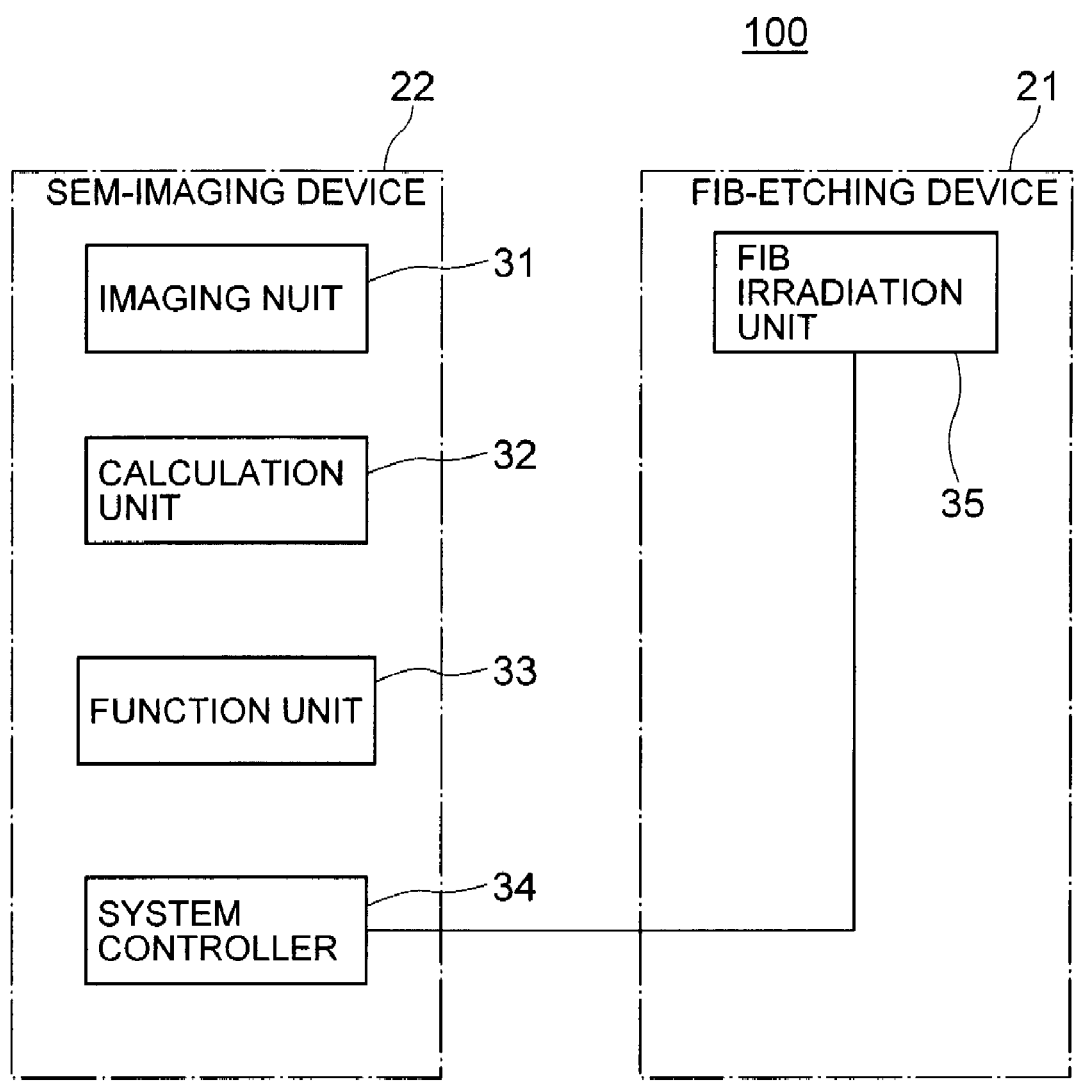
FIG. 5 is a block diagram exemplifying the FIB-SEM processing system according to the present invention.
Figure 5A:
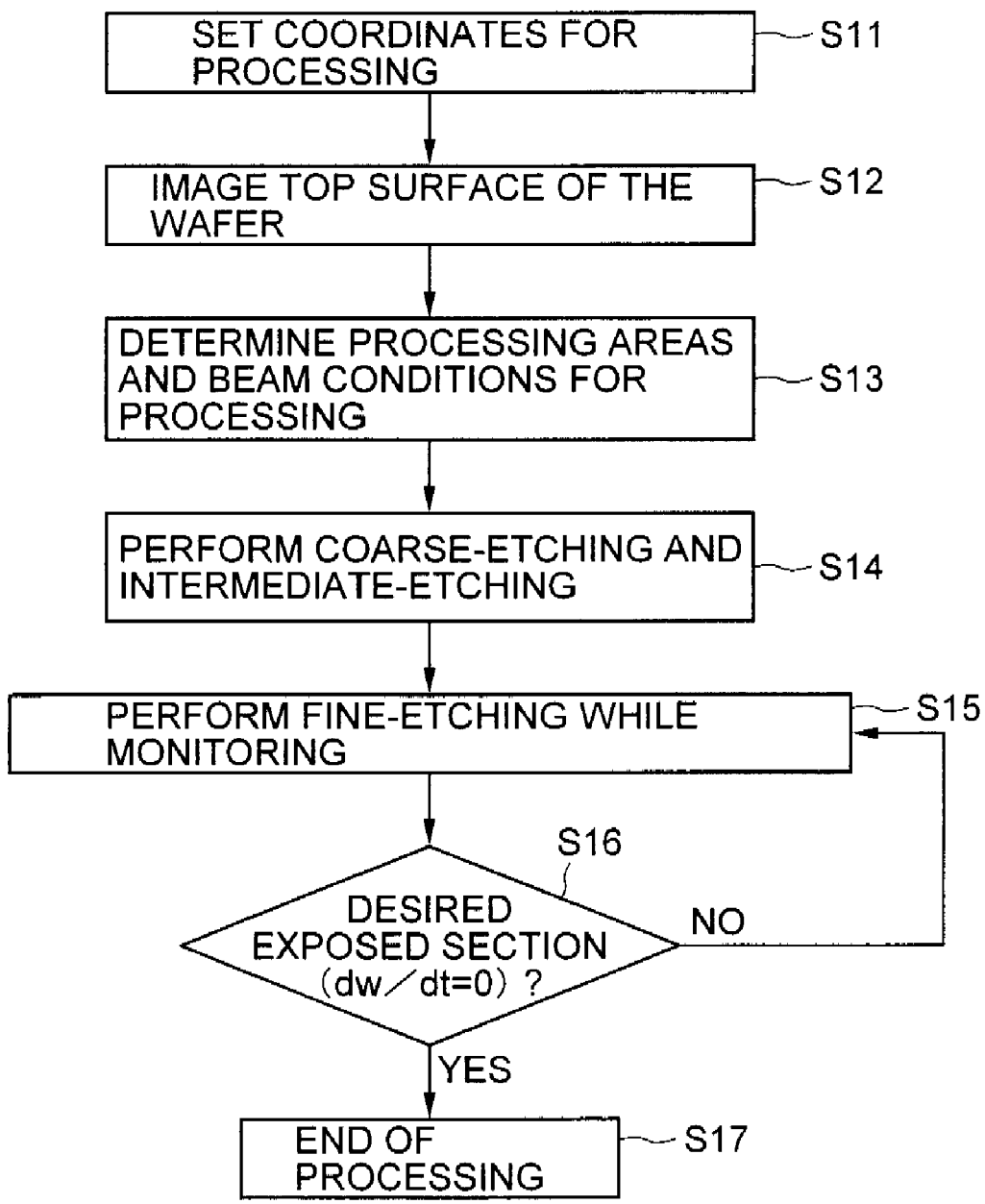
FIG. 5A is a flowchart showing the procedure of a FIB-etching processing according to a first embodiment of the present invention.

FIG. 5 is a block diagram exemplifying the FIB-SEM system (FIB-etching processing system) performing the FIB-etching processing according to the present invention. In FIG. 5A, The FIB-SEM system includes a FIB-etching device 21 and a SEM-imaging device 22. The FIB-etching device 21 includes a FIB irradiation unit 35, whereas the SEM-imaging device 22 includes an imaging unit 31, a calculation unit 32, a function unit 33 and a system controller 34.

The FIB irradiation unit 35 irradiates a wafer onto the main surface thereof to expose a vertical section within the wafer to expose the pattern formed within the wafer. The imaging unit 31 images the section of the pattern exposed by the FIB irradiation unit 35. The calculation unit 32 calculates the pattern size exposed on the section based on the image obtained by the imaging unit 31. The function unit 33 determines the function of the pattern size with respect to the elapsed time of the FIB-etching processing based on the relationship between the pattern size and the time instant. The system controller 34 controls the stop of the FIB-etching unit 35 based on the function at the time instant at which the pattern size assumes a maximum. The system controller 34 controls other units in the system. The FIB-SEM of FIG. 5 system performs the FIB-etching processing of a second embodiment of the present invention, which will be described later.

FIG. 5A is a flowchart showing the procedure of a FIB-etching processing according to a first embodiment of the present invention. The process includes the step of mounting a semiconductor wafer as the target for the FIB-etching processing on a stage of the FIB-SEM system, and detecting the reference position of the semiconductor wafer by using the SEM device to determine the processing coordinates on the semiconductor wafer (step S11). Subsequently, the FIB-SEM system obtains the image of the wafer surface before the start of processing (step S12). Thereafter, the processing areas are determined on the image of the wafer surface, together with conditions of the FIB irradiation (step S13). The FIB irradiation and supply of source gas are performed onto the protective-film processing area 12 to form the protective film. Thereafter, the FIB-etching processing is started to consecutively perform the coarse-etching treatment and intermediate-etching treatment (step S14).

Subsequently, a fine-etching treatment is started, while monitoring the etched section by the SEM image (step S15). The pattern width w of the contact plugs is calculated based on the SEM image, followed by calculating the temporal differential, dw/dt, to judge whether or not dw/dt=0 is satisfied (step S16). The fine-etching treatment is continued after returning to step S115, unless dw/dt=0 is satisfied in step S16, whereas the FIB-etching processing is finished after advancing to step S17, if dw/dt=0 is satisfied in step S16.

The FIB-etching processing of the present embodiment reduces the time length needed for the conventional FIB-etching processing. This is because the desired exposed section can be obtained without a judgment by a user in the present embodiment, whereas the conventional technique necessitated the judgment as to whether or not the desired section is obtained, and also necessitated correction of the exposed section by the user, both requiring a longer-time processing. In one example, the conventional technique required a time length of about 40 minutes for obtaining the desired section in the FIB-etching processing, whereas the first embodiment required only about 20 minutes.

Figure 6:
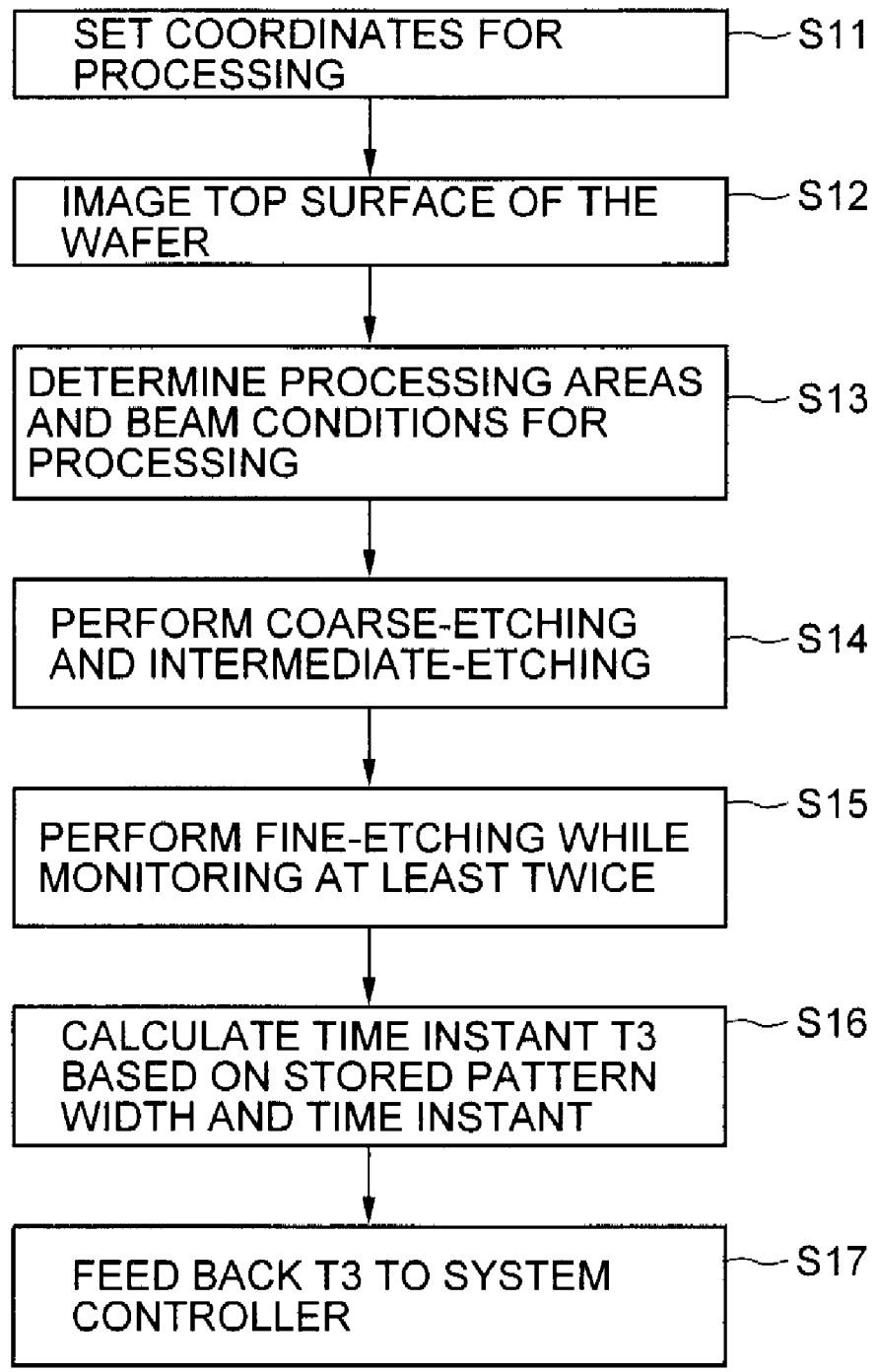
FIG. 6 is a flowchart showing the procedure of a FIB-etching processing according to a second embodiment of the present invention.

FIG. 6 shows the procedure of a FIB-etching processing according to a second embodiment of the present invention. The FIB-etching processing includes the steps of mounting a semiconductor wafer as a target for the FIB-etching processing on the stage of the FIB-SEM system, detecting the reference position of the wafer by using the SEM device, and determining the coordinates of the FIB-etching processing on the wafer (step S11). Subsequently, the image of the wafer surface before the FIB-etching processing is obtained (step S12), followed by determining the processing areas for the respective treatments as well as the beam conditions (step S13). A tungsten protective film is then formed on the wafer surface, followed by starting the FIB-etching processing to consecutively perform the coarse-etching treatment and intermediate-etching treatment (step S14).

Thereafter, a fine-etching treatment is started while monitoring the etched section on the SEM image. During the fine-etching treatment, the SEM image of the section is picked up for at least twice, before the pattern width assumes a maximum and after the contact plugs appear on the etched section (step S15). The pattern width (w1, w2, for example) of the contact plugs is calculated from the sectional SEM image, followed by calculating the time instant T3 from the image pick-up time instant (T1, T2) of the pattern width (w1, w2) thus calculated (step S16). The time instant T3 is fed back to the system controller, to end the FIB-etching processing at the time instant T3 (step S17). In the present embodiment, the pick-up of SEM image performed twice allows the time instant T3, at which the pattern width is equal to the diameter of the contact plugs, to be calculated based on the function of the pattern size with respect to the processing time.

Figure 7:
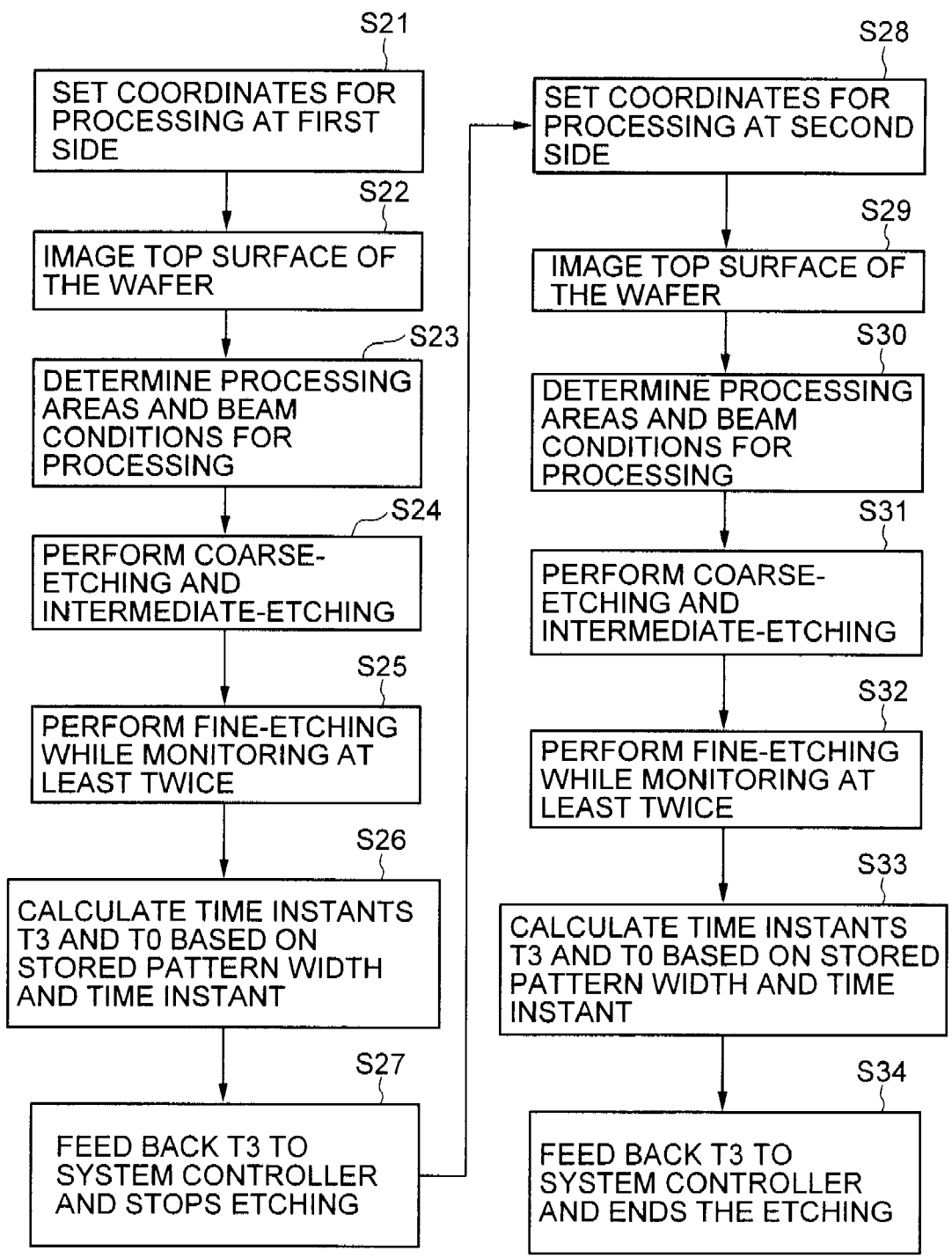
FIG. 7 is a flowchart showing the procedure of a FIB-etching processing according to a third embodiment of the present invention.

FIG. 7 shows the procedure of a FIB-etching processing according to a third embodiment of the present invention. The FIB-etching processing includes the steps of mounting a semiconductor wafer as the target for the FIB-etching processing on the stage of the FIB-SEM system, detecting the reference position of the wafer, and determining the coordinates for processing on the wafer (step S21). Subsequently, the image of the wafer before the FIB-etching processing is obtained (step S22), followed by determining the processing areas for the respective treatments as well as the beam conditions (step S23). A tungsten protective film is then formed on the wafer surface, followed by starting the FIB-etching processing to consecutively perform the coarse-etching treatment and intermediate-etching treatment at a first side of the contact plugs (step S24). Thereafter, a fine-etching treatment is started while monitoring the etched section on the SEM image. During the fine-etching treatment at the first side, the sectional SEM image is picked up for at least twice, before the pattern width assumes a maximum and after the contact plugs appear on the etched section (step S25). The process up to this step is similar to that of the second embodiment.

The pattern width (w1, w2) of the target contact plugs is obtained from the SEM image, followed by calculating the specific time instant (T0, T3) from the time instant (T1, T2), at which the image is picked up, and the pattern width (step S26). Subsequently, a specific time instant is selected, based on the time instants T0 and T3, which resides within the range between:

$$T3-(T3-T0)\times(1/4) \text{ and } T3-(T3-T0)\times(3/4).$$

The selected time instant is fed back to the system controller, to stop the FIB-etching processing at this selected time instant (step S27).

Subsequently, the coordinates on the wafer are determined at which the FIB-etching processing is to be performed at a second side of the contact plugs, i.e., at the opposite side of the target contact plugs which has not been subjected to the FIB-etching processing (step S28). The image of the wafer is picked up on the top surface of the wafer (step S29), followed by determining the processing areas and the conditions of the FIB irradiation (step S30), to start formation of the protective film and then the FIB-etching processing including the coarse-etching treatment and intermediate-etching treatment (step S31). Thereafter, a fine-etching treatment is started and at least two SEM images on the section are picked up (step S32). From the SEM image of the section, the time instants T0 and T3 are determined (step S33). Thereafter, a specific time instant is selected, based on the time instants T0 and T3, which resides between the time instants:

$$T3-(T3-T0)\times(1/4) \text{ and } T3-(T3-T0)\times(3/4).$$

The specific time instant selected at the second side is similar to the time instant selected before at the first side of the contact plugs. The selected time instant is fed back to the system controller, which ends the FIB-etching processing at the received time instant (step S34).

Figure 8:
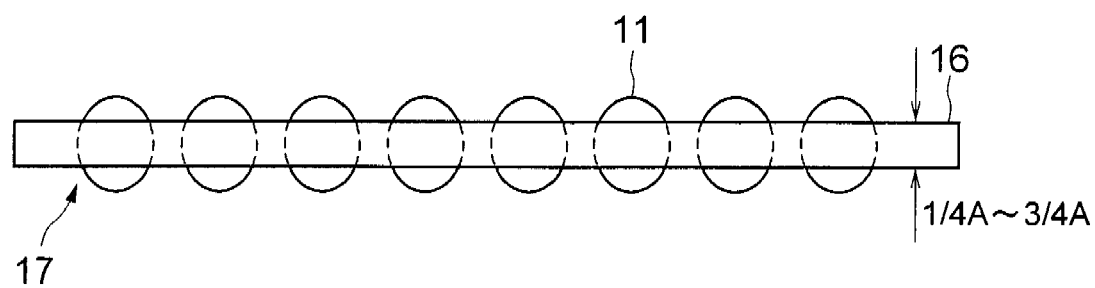
FIG. 8 is a top plan view of a sample obtained in the third embodiment.
Figure 9:
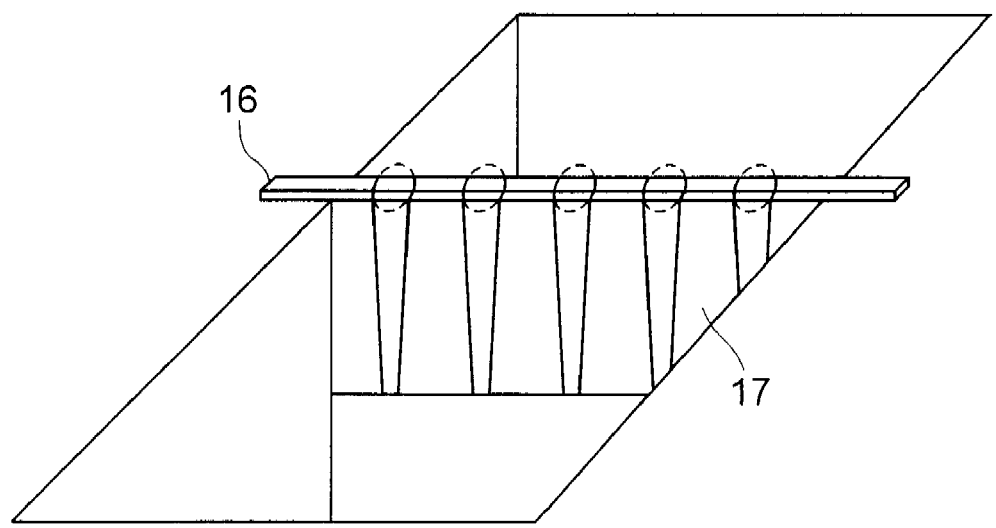
FIG. 9 is a perspective view of the sample obtained in the third embodiment.

FIG. 8 is a top plan view of a sample including the target contact plugs obtained by the FIB-etching processing in the present embodiment, and FIG. 9 is a perspective view (bird's-eye view) thereof. The pattern of contact plugs 11, the top of which is protected by the protective film 16, is shown in these drawings. The sample includes a thin wall having both sides formed by the FIB-etching processing and including therein part of contact plugs having a thickness roughly equal to 1/2 to 1/4 of the original diameter of the contact plugs 11. The internal image of the sample wall having such a thickness is obtained by a TEM device. The TEM image of the internal of wall obtained by the TEM device can be effectively analyzed due to the small thickness of the sample wall obtained by the FIB-etching processing at both side of the contact plugs. In the present embodiment, the FIB-etching processing should be stopped before the maximum width of the contact plugs appear on the section, to obtain an effective TEM image. This processing is achieved in this embodiment due to the section having a pattern width roughly equal to 1/2 to 1/4 of the diameter of the contact plugs.

In the above embodiments, the concrete process for determining the diameter of the contact plugs based on the SEM image is omitted for description because the concrete process is well known in this art. Similarly, the concrete process for determining the time instant T0, T3 based on the pattern width w1, w2 obtained at the time instant T1, T2 is well known, and thus the description thereof is omitted herein.

In the above embodiments, contact plugs having a circular cross section are exemplified for determining the time instant at which the contact plugs have the pattern width equal to the diameter thereof. However, the present invention is not limited to this example in which the contact plugs have a circular cross section. It is sufficient that the contact plugs have a designed specific shape in the cross section thereof, so long as the differential of the pattern width of the contact plugs provides the time instant at which the contact plugs have the maximum diameter or so long as two sections measured at arbitrary time instants provide the time instant at which the contact plugs have the maximum pattern width.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A focused ion beam (FIB) processing system comprising:
   a FIB irradiation unit that irradiates a FIB onto a pattern formed in a wafer, to form
   a section of the pattern that intersects a top surface of the wafer;
   an imaging unit that images the section of the pattern;
   a calculation unit that calculates a pattern size w, wherein w is expressed as $w = A \sin \omega(t-T0)$, where A is a dimension of the pattern, and a differential, $dw/dt$, of the pattern size w as a function of time t, based on the image of the section;
   a judgment unit that judges whether or not the calculated differential, $dw/dt$, of the pattern size is equal to or below a threshold; and
   a control unit that stops said FIB irradiation unit if said judgment unit judges that the differential, $dw/dt$, of the pattern size is equal to or below the threshold.

2. A focused ion beam (FIB) processing system comprising:
   a FIB irradiation unit that irradiates a FIB onto a pattern formed in a wafer, to form
   a section of the pattern that intersects a top surface of the wafer;
   an imaging unit that images the section of the pattern;
   a calculation unit that calculates a pattern size w, wherein w is expressed as $w = A \sin \omega(t-T0)$, where A is a dimension of the pattern, based on the image of the section, to store in a storage device the pattern size in association with a time instant t at which the section of the pattern is imaged;
   a function unit that determines a time function of the pattern size w, wherein the time function expresses change in the pattern size w as a function of time instant t; and
   a control unit that controls a stop position of said FIB irradiation unit based on the time function.

3. The FIB-etching processing system according to claim 2, wherein the time function is a differential, $dw/dt$, of the pattern size w as a function of time t, and said control unit stops said FIB irradiation unit at a time instant when the differential, $dw/dt$, assumes zero.

4. The FIB-etching processing system according to claim 2, wherein said function unit determines the time function based on the pattern sizes measured at two or more time instants.

5. The FIB-etching processing system according to claim 4, wherein said function unit estimates a time instant at which the pattern size assumes a maximum.

6. The FIB-etching processing system according to claim 5, wherein said control unit stops said FIB irradiation unit before a time instant at which said pattern size assumes a maximum.

7. The FIB-etching processing system according to claim 6, wherein said FIB irradiation unit irradiates the FIB at both sides of said pattern, and said control unit stops said FIB irradiation unit before the time instant at which said pattern size assumes a maximum, during FIB irradiation at both sides of the pattern.

8. The FIB-etching processing system according to claim 7, further comprising a transmission electron microscope that analyzes an internal of the pattern between both the sections, wherein said imaging unit is a scanning electron microscope.

9. A focused ion beam (FIB) processing method comprising:
irradiating a FIB onto a pattern formed in a wafer, to form a section of the pattern that intersects a top surface of the wafer;
imaging the section of the pattern;
calculating a pattern size w on the section, wherein w is expressed as w=A sin ω(t-T0), where A is a dimension of the pattern, and a differential, dw/dt, of the pattern size w as a function of time t, based on the image of the section;
judging whether or not the calculated differential, dw/dt, of the pattern size is equal to or below a threshold; and
stopping said FIB irradiation if it is judged that the differential, dw/dt, of the pattern size is equal to or below the threshold.

10. A focused ion beam (FIB) processing method comprising:
irradiating a FIB onto a pattern formed in a wafer, to form a section of the pattern that intersects a top surface of the wafer;
imaging the section of the pattern;
calculating a pattern size w on the section wherein w is expressed as w=A sin ω(t-T0), where A is a dimension of the pattern, based on the image of the section, to store the pattern size in association with a time instant t at which the section of the pattern is imaged;
determining a time function of the pattern size w, wherein the time function expresses change in the pattern size w as a function of time instant t; and controlling a stop position of said FIB irradiation based on the time function.

* * * * *